(12) United States Patent
Choi

(10) Patent No.: US 11,004,487 B2
(45) Date of Patent: May 11, 2021

(54) SEMICONDUCTOR DEVICE AND SEMICONDUCTOR SYSTEM

(71) Applicant: SK hynix Inc., Icheon-si (KR)

(72) Inventor: Sun Myung Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 23 days.

(21) Appl. No.: 16/545,142

(22) Filed: Aug. 20, 2019

(65) Prior Publication Data

US 2020/0286534 A1  Sep. 10, 2020

(30) Foreign Application Priority Data

Mar. 5, 2019 (KR) ............. 10-2019-0025319

(51) Int. Cl.
*G11C 7/22* (2006.01)
*G11C 29/46* (2006.01)
*G11C 7/10* (2006.01)

(52) U.S. Cl.
CPC ............. *G11C 7/222* (2013.01); *G11C 7/106* (2013.01); *G11C 7/109* (2013.01); *G11C 7/1045* (2013.01); *G11C 7/1063* (2013.01); *G11C 7/1066* (2013.01); *G11C 7/1087* (2013.01); *G11C 7/1093* (2013.01); *G11C 29/46* (2013.01)

(58) Field of Classification Search
CPC ...................................... G11C 7/222
USPC ............................................. 365/193
See application file for complete search history.

(56) References Cited

U.S. PATENT DOCUMENTS

| 6,202,123 | B1 * | 3/2001 | Mukai ............... | G11C 16/102 711/103 |
| 9,076,499 | B2 | 7/2015 | Schoenborn et al. | |
| 2003/0179614 | A1 * | 9/2003 | Kono ................ | G11C 7/106 365/198 |
| 2018/0046436 | A1 * | 2/2018 | Lu .................... | G11C 11/418 |
| 2018/0287793 | A1 * | 10/2018 | Khatib Zadeh .... | G11C 13/0004 |

FOREIGN PATENT DOCUMENTS

KR   101733567 B1   5/2017

* cited by examiner

*Primary Examiner* — Muna A Techane
(74) *Attorney, Agent, or Firm* — William Park & Associates Ltd.

(57) ABSTRACT

A semiconductor system including a semiconductor device configured to operate in various modes to generate output data having different patterns.

25 Claims, 13 Drawing Sheets

FIG. 4

| MD_SEL | CODE<1> | CODE<2> | CODE<3> | SR_M | CK_M<1> | CK_M<2> | LF_M<1> | LF_M<2> |
|---|---|---|---|---|---|---|---|---|
| H | L | X | X | H | L | L | L | L |
| H | H | L | L | L | H | H | L | L |
| H | H | L | H | L | H | L | L | H |
| H | H | H | L | L | L | H | H | L |
| H | H | H | H | L | L | L | H | H |

SEMICONDUCTOR DEVICE AND SEMICONDUCTOR SYSTEM

CROSS-REFERENCE TO RELATED APPLICATION

The present application claims priority under 35 U.S.C. § 119(a) to Korean Patent Application No. 10-2019-0025319 filed on Mar. 5, 2019 in the Korean Intellectual Property Office, which is incorporated herein by reference in its entirety.

BACKGROUND

1. Technical Field

Embodiments of the disclosure may generally relate to a semiconductor device and a semiconductor system which generate data having various patterns.

2. Related Art

Before a semiconductor device begins its various operations, it is tested for failures by testing its internal circuits. Only the semiconductor devices which do not have a failure are deemed to operate normally. Therefore, tests on a semiconductor device which pertain to the starting of an operation are important.

A semiconductor device stores and outputs data depending on an operation mode. The semiconductor device stores data within memory cells and outputs data from memory cells based on the type of operation being performed by the semiconductor device. For example, if a read request is issued by a controller or the like, the semiconductor device performs a read operation to output data from its memory cells corresponding to an inputted address. For example, if a write request is issued by the controller or the like, the semiconductor device performs a write operation to store data in its memory cells corresponding to an inputted address.

With the development of technology, a semiconductor device requires an increasingly larger number of memory cells to store more data, and various methods are demanded to test such memory cells.

SUMMARY

In an embodiment, a semiconductor device may include: a data processing circuit configured to receive an operation signal including a first combination of bits and generate internal data including the first combination of bits when the semiconductor device is operating in a serial mode, generate internal data including sequential bits including alternating logic values when the semiconductor device is operating in a clock mode, and generate internal data including a random combination of bits, the logic levels of which are generated randomly when the semiconductor device is operating in a random mode; and a memory circuit including a plurality of memory cells, and configured to store the internal data in the plurality of memory cells and generate output data from the stored internal data.

In an embodiment, a semiconductor system may include: a first semiconductor device configured to output a mode select signal, a code signal, and an operation signal, and receive output data; and a second semiconductor device configured to operate in a serial mode, a clock mode, and a random mode depending on the mode select signal and the code signal, generate internal data including a first combination of bits from the operation signal of which has the first combination of bits when operating in the serial mode, generate internal data including sequential bits including alternating logic values when operating in the clock mode, generate internal data including a random combination of bits, the logic levels of which are generated randomly when operating in the random mode, store the internal data, and output the internal data as the output data.

BRIEF DESCRIPTION OF THE DRAWINGS

FIG. 4 is a representation of an example of a table to assist in the explanation of the operation of the operation control circuit illustrated in FIG. 3.

DETAILED DESCRIPTION

Hereinafter, a semiconductor device and a semiconductor system will be described below with reference to the accompanying drawings through various examples of embodiments.

Various embodiments may be directed to a semiconductor device and a semiconductor system which generate data having various patterns depending on a combination of code signals, thereby testing memory cells.

According to some embodiments of the disclosure, it may be possible to enter a plurality of operation modes depending on a combination of code signals and generate data having different patterns according to the respective operation modes.

According to some embodiments of the disclosure, it may be possible to enter a plurality of operation modes for generating data having various patterns depending on a combination of code signals and test a plurality of memory cells by using the data having the various patterns.

Figure 1:
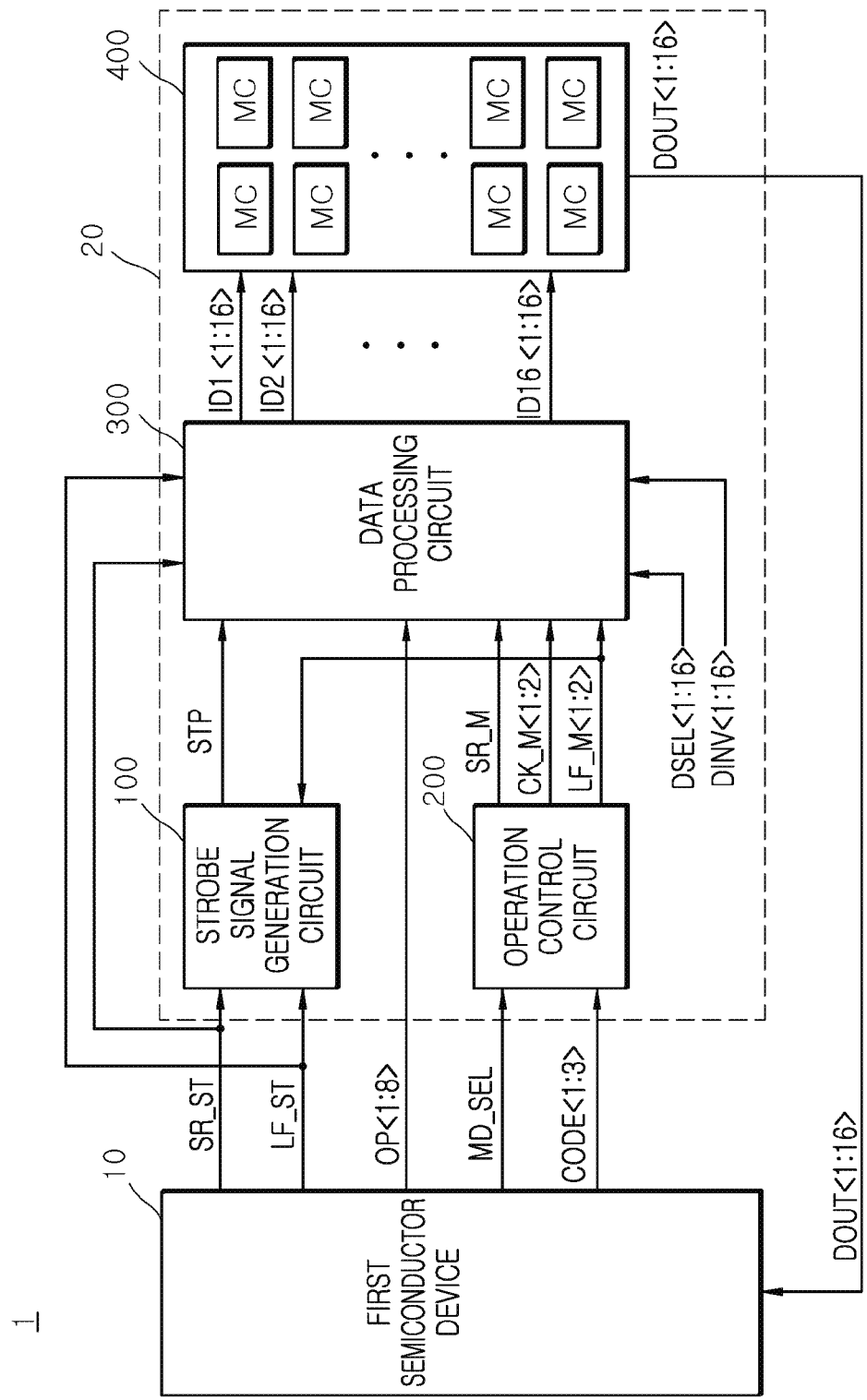
FIG. 1 is a block diagram illustrating a representation of an example of the configuration of a semiconductor system in accordance with an embodiment of the disclosure.

Referring to FIG. 1, a semiconductor system 1 in accordance with an embodiment of the disclosure may include a first semiconductor device 10 and a second semiconductor device 20.

The first semiconductor device 10 may output a mode select signal MD_SEL, first to third code signals CODE<1:3>, a serial start signal SR_ST, a random start signal LF_ST and an operation signal OP<1:8> to the second semiconductor device 20. In an embodiment, the second semiconductor device 20 may receive an operation signal OP<1:8> from an exterior of the second semiconductor device 20. The mode select signal MD_SEL and the first to third code signals CODE<1:3> may be outputted to various logic levels for entering the second semiconductor device 20 into a serial mode, a clock mode and a random mode. The serial start signal SR_ST may be set as a signal which is enabled to operate the second semiconductor device 20 in the serial mode. The random start signal LF_ST may be set as a signal which is enabled to operate the second semiconductor device 20 in the random mode. The operation signal OP<1:8> may be outputted as a signal which has various logic levels. The logic level combinations of the mode select signal MD_SEL and the first to third code signals CODE<1:3> for entering the serial mode, the clock mode and the random mode will be described later with FIG. 4.

The first semiconductor device 10 may receive output data DOUT<1:16>. The first semiconductor device 10 may sense the logic level of the output data DOUT<1:16> and thereby test a failure of a memory circuit 400 included in the second semiconductor device 20. The first semiconductor device 10 may determine that the memory circuit 400 included in the second semiconductor device 20, has failed, when the logic level of the output data DOUT<1:16> does not match a preset logic level. The word "preset" as used herein with respect to a parameter, such as a preset logic level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The serial mode may be set as an operation of comparing the logic level combinations of the bits of the operation signal OP<1:8> and the bits of the output data DOUT<1:16> and thereby testing a failure of the memory circuit 400 included in the second semiconductor device 20. In an embodiment, the serial mode may be an operation for comparing predetermined logic levels of bit combinations for the bits of the operation signal OP<1:8> and the bits of the output data DOUT<1:16>. For example, while the semiconductor device 20 is operating in the serial mode the operation signal OP<1:8> may have a first combination of bits and the output data DOUT<1:16> may include the first combination of bits. The clock mode may be set as an operation of sensing that the logic levels of the adjacent bits included in the output data DOUT<1:16> are realized as different logic levels and thereby testing a failure of the memory circuit 400 included in the second semiconductor device 20. In an embodiment, the output data DOUT<1:16> for a clock mode operation may have sequential bits having alternating logic values. For example, the bit patterns may have alternating zeros and ones or ones and zeros (i.e., 0101010101010101 or 1010101010101010). The random mode may be set as an operation of sensing the logic levels of the output data DOUT<1:16>, the bits of which are generated randomly, and thereby testing a failure of the memory circuit 400 included in the second semiconductor device 20. In an embodiment, the random mode may be set as an operation for randomly generating logic levels of the bits included in the output data DOUT<1:16>. For example, in a random mode the bits of the output data DOUT<1:16> may have a random combination.

The second semiconductor device 20 may include a strobe signal generation circuit 100, an operation control circuit 200, a data processing circuit 300 and the memory circuit 400.

The strobe signal generation circuit 100 may generate a strobe signal STP which includes a pulse generated in the case where any one of the serial start signal SR_ST and the random start signal LF_ST is inputted. The strobe signal generation circuit 100 may generate the strobe signal STP which includes a pulse generated from the random start signal LF_ST in the case where first and second random mode signals LF_M<1:2> are enabled. The strobe signal generation circuit 100 may generate the strobe signal STP which includes a pulse generated from the serial start signal SR_ST in the case where the first and second random mode signals LF_M<1:2> are disabled.

The operation control circuit 200 may generate a serial mode signal SR_M, first and second clock mode signals CK_M<1:2> and the first and second random mode signals LF_M<1:2> which are enabled depending on the logic level combination of the mode select signal MD_SEL and the first to third code signals CODE<1:3>. The logic level combination of the mode select signal MD_SEL and the first to third code signals CODE<1:3> for generating the serial mode signal SR_M, the first and second clock mode signals CK_M<1:2> and the first and second random mode signals LF_M<1:2> will be described later through FIG. 4. In an embodiment, the operation control circuit 200 may be configured to generate a serial mode signal SR_M, first and second clock mode signals CK_M<1:2> and the first and second random mode signals LF_M<1:2> depending on a logic level combination of a mode select signal MD_SEL and code signals (i.e., first to third code signals CODE<1:3>) to enter the data processing circuit into the serial mode, the clock mode, or the random mode.

The data processing circuit 300 may generate first internal data ID1<1:16> from the operation signal OP<1:8> in the case where the serial mode signal SR_M is enabled in synchronization with the strobe signal STP. The data processing circuit 300 may generate the first internal data ID1<1:16> from the operation signal OP<1:8> depending on the logic level of a first data inversion signal DINV<1> in the case where the serial mode signal SR_M and a first data select signal DSEL<1> are enabled in synchronization with the strobe signal STP. The data processing circuit 300 may generate the first internal data ID1<1:16> from first and second voltages. In an embodiment, the first voltage is different from the second voltage. In some embodiments, the first voltage may be greater than the second voltage. In some embodiments, the first voltage may be supplied from an external power VDD received from an outside of the second semiconductor device 20 and the second voltage may be supplied from an external power VSS received from an outside of the second semiconductor device 20. In some embodiments, the first and second voltages are received externally from the second semiconductor device 20 and by the second semiconductor device 20 when the second semiconductor device 20 is operating in a clock mode to generate the internal data ID1<1:16>. In some embodiments, the second voltage may be a ground voltage. In some embodiments, the second voltage may be a negative voltage. In some embodiments, the data processing circuit 300 may generate the first internal data ID1<1:16> from external powers VDD and VSS (see FIG. 6) in the case where the first and second clock mode signals CK_M<1:2> are enabled. The data processing circuit 300 may generate the first internal data ID1<1:16> from the external powers VDD and VSS (see FIG. 6) depending on the logic level of the first data inversion signal DINV<1> in the case where the first and second clock mode signals CK_M<1:2> and the first data select signal DSEL<1> are enabled. The data processing circuit 300 may generate the first internal data ID1<1:16> having a random logic level combination in the case where the first and second random mode signals LF_M<1:2> are enabled. The data processing circuit 300 may generate the first internal data ID1<1:16> having a random logic level combination depending on the logic level of the first data inversion signal DINV<1> in the case where the first and second random mode signals LF_M<1:2> and the first data select signal DSEL<1> are enabled. Because operations in which the data processing circuit 300 generates second internal data ID2<1:16> to sixteenth internal data ID16<1:16> are the same as the operation of generating the first internal data ID1<1:16> except that only input/output signals are different, detailed descriptions thereof will be omitted herein.

The memory circuit 400 may include a plurality of memory cells MC. The memory circuit 400 may store the first to sixteenth internal data ID1<1:16> to ID16<1:16> in the plurality of memory cells MC. The memory circuit 400 may generate the output data DOUT<1:16> from any one among the first to sixteenth internal data ID1<1:16> to ID16<1:16> stored in the plurality of memory cells MC.

The second semiconductor device 20 configured as mentioned above may enter the serial mode, the clock mode and the random mode depending on the logic level combination of the mode select signal MD_SEL and the first to third code signals CODE<1:3>. The second semiconductor device 20 may generate the output data DOUT<1:16> from the operation signal OP<1:8> in synchronization with the serial start signal SR_ST while operating in the serial mode. The second semiconductor device 20 may generate the output data DOUT<1:16> from the external powers VDD and VSS (see FIG. 6) while operating in the clock mode. The second semiconductor device 20 may generate the output data DOUT<1:16> having a random combination in synchronization with the random start signal LF_ST while operating in the random mode.

Figure 2:
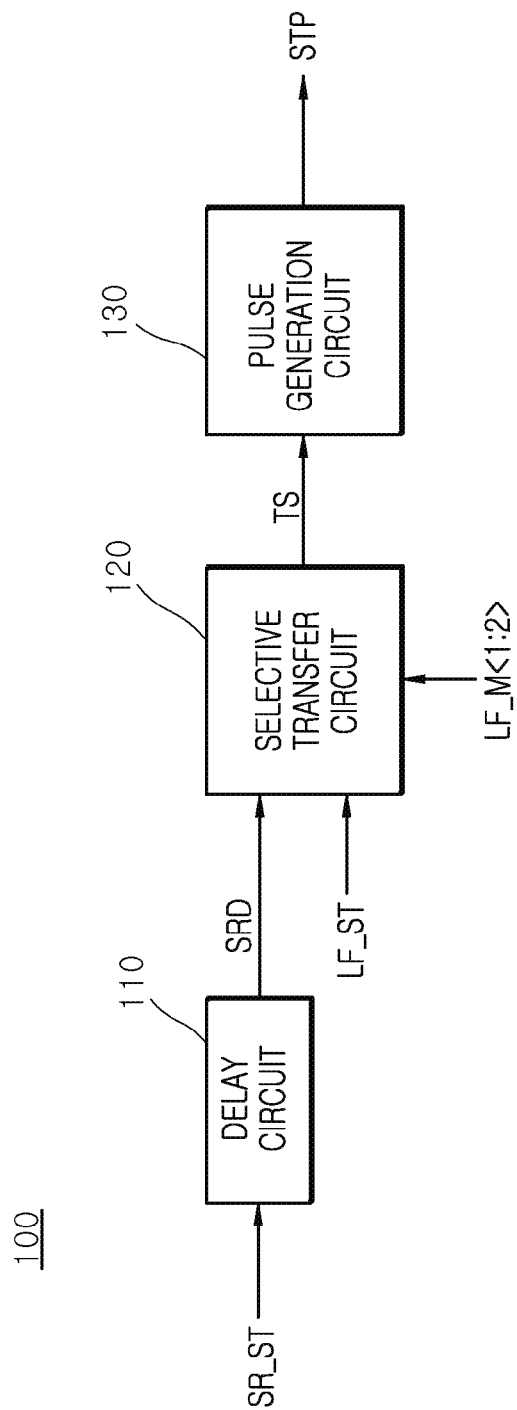
FIG. 2 is a block diagram illustrating a representation of an example of the configuration of the strobe signal generation circuit included in the second semiconductor device illustrated in FIG. 1.

Referring to FIG. 2, the strobe signal generation circuit 100 may include a delay circuit 110, a selective transfer circuit 120 and a pulse generation circuit 130.

The delay circuit 110 may delay the serial start signal SR_ST and thereby generate a serial delay signal SRD. A delay time for delaying the serial start signal SR_ST may be set variously depending on an embodiment. For example, a delay time for delaying the serial start signal SR_ST may be set to a time for generating random data LFSR<1:16> illustrated in FIG. 6.

The selective transfer circuit 120 may generate a transfer signal TS from any one of the serial delay signal SRD and the random start signal LF_ST depending on the logic levels of the first and second random mode signals LF_M<1:2>. The selective transfer circuit 120 may output the serial delay signal SRD as the transfer signal TS in the case where both the first and second random mode signals LF_M<1:2> are disabled. The selective transfer circuit 120 may output the random start signal LF_ST as the transfer signal TS in the case where any one of the first and second random mode signals LF_M<1:2> is enabled.

The pulse generation circuit 130 may generate the strobe signal STP which includes a pulse generated in the case where the transfer signal TS is inputted. The pulse generation circuit 130 may generate the strobe signal STP which includes a pulse of a logic high level, in the case where the transfer signal TS is enabled to a logic high level. The pulse included in the strobe signal STP may be set to a logic low level depending on an embodiment. A high level and a low level, as used herein with respect to signals, refer to logic levels of the signals. A signal having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

Figure 3:
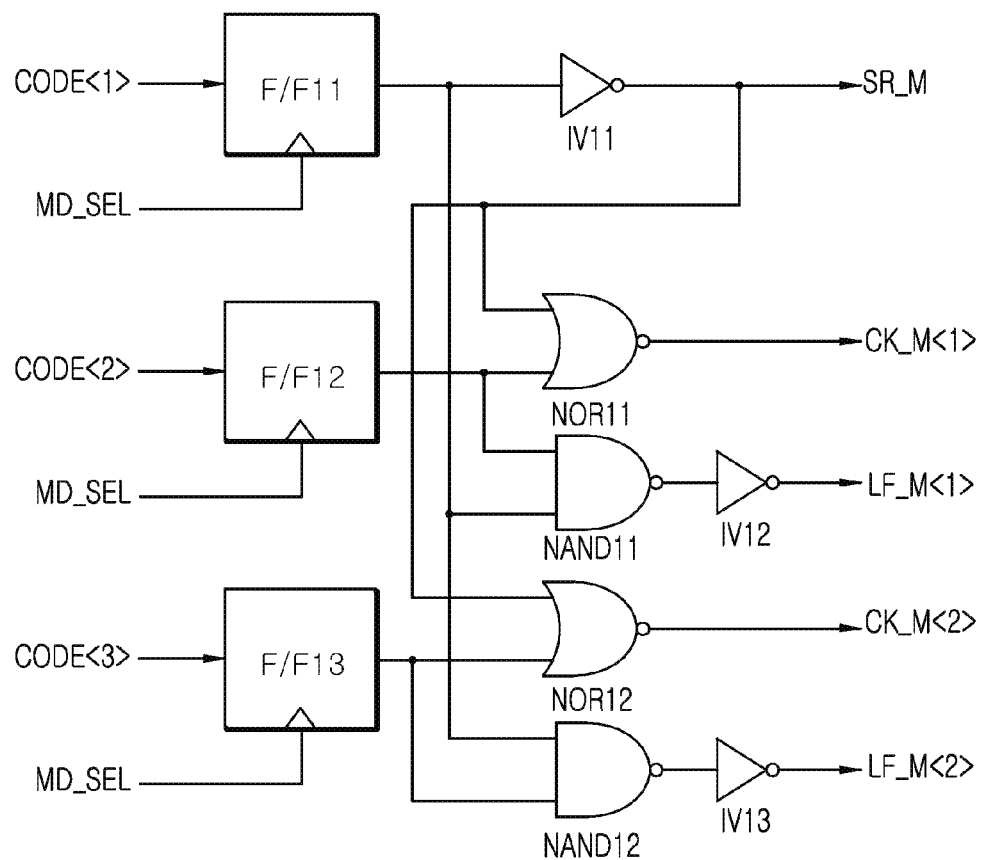
FIG. 3 is a diagram illustrating a representation of an example of the configuration of the operation control circuit included in the second semiconductor device illustrated in FIG. 1.

Referring to FIG. 3, the operation control circuit 200 may be configured to perform logic operations. In an embodiment, the operation control circuit 200 may be realized by, for example but not limited to, flip-flops F/F11, F/F12 and F/F13, inverters IV11, IV12 and IV13, NOR gates NOR11 and NOR12 and NAND gates NAND11 and NAND12.

The flip-flop F/F11 may receive and output the first code signal CODE<1> in the case where the mode select signal MD_SEL is inputted at a logic high level.

The flip-flop F/F12 may receive and output the second code signal CODE<2> in the case where the mode select signal MD_SEL is inputted at the logic high level.

The flip-flop F/F13 may receive and output the third code signal CODE<3> in the case where the mode select signal MD_SEL is inputted at the logic high level.

The inverter IV11 may invert and buffer the output signal of the flip-flop F/F11 and thereby generate the serial mode signal SR_M.

The NOR gate NOR11 may invert and buffer the output signal of the flip-flop F/F12 and thereby generate the first clock mode signal CK_M<1> in the case where the serial mode signal SR_M is disabled to a logic low level.

The NAND gate NAND11 and the inverter IV12 may buffer the output signal of the flip-flop F/F12 and thereby generate the first random mode signal LF_M<1> in the case where the output signal of the flip-flop F/F11 is at a logic high level.

The NOR gate NOR12 may invert and buffer the output signal of the flip-flop F/F13 and thereby generate the second clock mode signal CK_M<2> in the case where the serial mode signal SR_M is disabled to the logic low level.

The NAND gate NAND12 and the inverter IV13 may buffer the output signal of the flip-flop F/F13 and thereby generate the second random mode signal LF_M<2> in the case where the output signal of the flip-flop F/F11 is at the logic high level.

The operation of the operation control circuit 200 to generate the serial mode signal SR_M, the first and second clock mode signals CK_M<1:2> and the first and second random mode signals LF_M<1:2> depending on the logic level combination of the mode select signal MD_SEL and the first to third code signals CODE<1:3> will be described hereunder with reference to FIG. 4.

The operation control circuit 200 may generate the serial mode signal SR_M which is enabled to a logic high level H, in the case where the mode select signal MD_SEL is inputted at the logic high level H and the first code signal CODE<1> is inputted at a logic low level L. At this time, the second code signal CODE<2> and the third code signal CODE<3> may be processed as a don't-care condition. FIG. 4 illustrates the value of a don't-care, or when the value is not considered, as an 'X'. In an embodiment, referring to FIGS. 1 and 4, the data processing circuit 300 may generate a first portion of first internal data ID1<1:8> including a first combination of bits matching the combination of bits of the operation signal OP<1:8> and a second portion of first internal data ID1<9:16> including the first combination of bits matching the combination of bits of the operation signal OP<1:8> when the serial mode signal SR_M is enabled.

The operation control circuit 200 may generate the first clock mode signal CK_M<1> which is enabled to a logic high level H and the second clock mode signal CK_M<2> which is enabled to a logic high level H, in the case where the mode select signal MD_SEL is at the logic high level H, the first code signal CODE<1> is at a logic is high level H, the second code signal CODE<2> is at a logic low level L and the third code signal CODE<3> is at a logic low level L. In an embodiment, referring to FIGS. 1 and 4, the data processing circuit 300 may generate a first portion of first internal data ID1<1:8> including sequential bits having alternating logic values and a second portion of first internal data ID1<9:16> including sequential bits having alternating logic values when the first and second clock mode signals CK_M<1> CK_M<2> are enabled.

The operation control circuit 200 may generate the first clock mode signal CK_M<1> which is enabled to the logic high level H and the second random mode signal LF_M<2> which is enabled to a logic high level H, in the case where the mode select signal MD_SEL is at the logic high level H, the first code signal CODE<1> is at the logic high level H, the second code signal CODE<2> is at the logic low level L and the third code signal CODE<3> is at a logic high level H. In an embodiment, referring to FIGS. 1 and 4, the data processing circuit 300 may generate a first portion of first internal data ID1<1:8> including sequential bits having alternating logic values and a second portion of first internal data ID1<9:16> including a random combination of bits when the first clock mode signal CK_M<1> and the second random mode signal LF_M<2> are enabled.

The operation control circuit 200 may generate the second clock mode signal CK_M<2> which is enabled to the logic high level is H and the first random mode signal LF_M<1> which is enabled to a logic high level H, in the case where the mode select signal MD_SEL is at the logic high level H, the first code signal CODE<1> is at the logic high level H, the second code signal CODE<2> is at a logic high level H and the third code signal CODE<3> is at the logic low level L. In an embodiment, referring to FIGS. 1 and 4, the data processing circuit 300 may generate a first portion of first internal data ID1<1:8> including a random combination of bits and a second portion of first internal data ID1<9:16> including sequential bits having alternating logic values when the second clock mode signal CK_M<2> and the first random mode signal LF_M<1> are enabled. Additionally, A high level H and a low level L, as used herein with respect to signals, refer to logic levels of the signals. A signal having a low level L distinguishes from the signal when it has a high level H. For example, the high level H may correspond to the signal having a first voltage, and the low level L may correspond to the signal having a second voltage. For some embodiments, the first voltage is greater than the second voltage. In other embodiments, different characteristics of a signal, such as frequency or amplitude, determine whether the signal has a high level H or a low level L. For some cases, the high and low levels of a signal represent logical binary states.

The operation control circuit 200 may generate the first random mode signal LF_M<1> which is enabled to the logic high is level H and the second random mode signal LF_M<2> which is enabled to the logic high level H, in the case where the mode select signal MD_SEL is at the logic high level H, the first code signal CODE<1> is at the logic high level H, the second code signal CODE<2> is at the logic high level H and the third code signal CODE<3> is at the logic high level H. In an embodiment, referring to FIGS. 1 and 4, the data processing circuit 300 may generate a first portion of first internal data ID1<1:8> including a random combination of bits and a second portion of first internal data ID1<9:16> including a random combination of bits when the first random mode signal LF_M<1> and the second random mode signal LF_M<2> are enabled.

Figure 5:
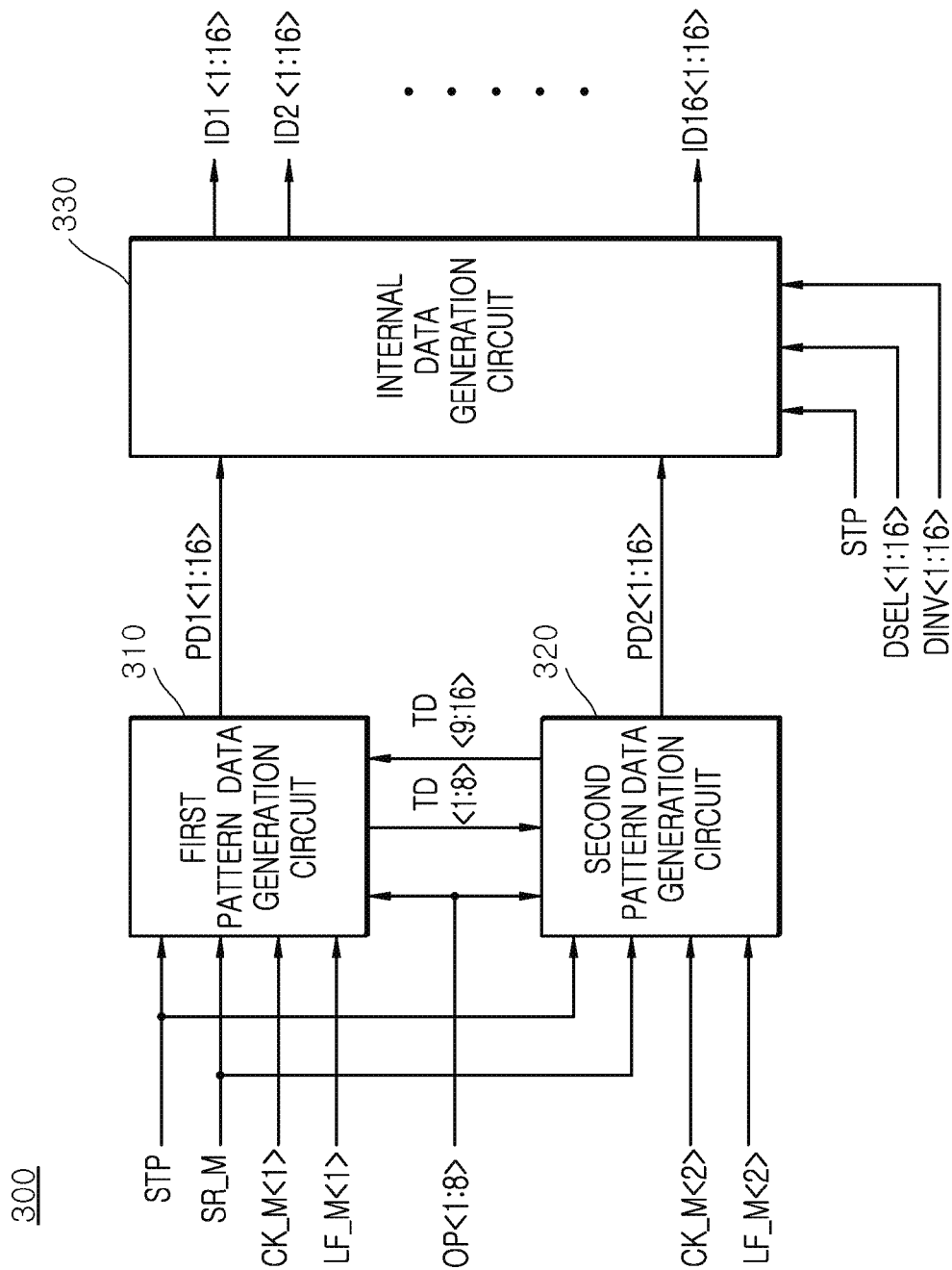
FIG. 5 is a block diagram illustrating a representation of an example of the configuration of the data processing circuit included in the second semiconductor device illustrated in FIG. 1.

Referring to FIG. 5, the data processing circuit 300 may include a first pattern data generation circuit 310, a second pattern data generation circuit 320 and an internal data generation circuit 330.

The first pattern data generation circuit 310 may generate first pattern data PD1<1:16> from the operation signal OP<1:8> in the case where the serial mode signal SR_M is enabled in synchronization with the strobe signal STP. The first pattern data generation circuit 310 may generate the first pattern data PD1<1:16> from the external powers VDD and VSS (see FIG. 6) in the case where the first clock mode signal CK_M<1> is enabled in synchronization with the strobe signal STP. The first pattern data generation circuit 310 may generate the first pattern data PD1<1:16> having a random combination in the case where the first random mode signal LF_M<1> is enabled in synchronization with the strobe signal STP. The first pattern data generation circuit 310 may generate the first to eighth bits PD1<1:8> of the first pattern data PD1<1:16> from first transfer data TD<1:8> in the case where the first random mode signal LF_M<1> is disabled in synchronization with the strobe signal STP. The first pattern data generation circuit 310 may generate the ninth to sixteenth bits PD1<9:16> of the first pattern data PD1<1:16> from second transfer data TD<9:16> in the case where the first random mode signal LF_M<1> is disabled in synchronization with the strobe signal STP.

The second pattern data generation circuit 320 may generate second pattern data PD2<1:16> from the operation signal OP<1:8> in the case where the serial mode signal SR_M is enabled in synchronization with the strobe signal STP. The second pattern data generation circuit 320 may generate the second pattern data PD2<1:16> from the external powers VDD and VSS (see FIG. 6) in the case where the second clock mode signal CK_M<2> is enabled in synchronization with the strobe signal STP. The second pattern data generation circuit 320 may generate the second pattern data PD2<1:16> having a random combination in the case where the second random mode signal LF_M<2> is enabled in synchronization with the strobe signal STP. The second pattern data generation circuit 320 may generate the first to eighth bits PD2<1:8> of the second pattern data PD2<1:16> from the second transfer data TD<9:16> in the case where the second random mode signal LF_M<2> is disabled in synchronization with the strobe signal STP. The second pattern data generation circuit 320 may generate the ninth to sixteenth bits PD2<9:16> of the second pattern data PD2<1:16> from the first transfer data TD<1:8> in the case where the second random mode signal LF_M<2> is disabled in synchronization with the strobe signal STP.

The internal data generation circuit 330 may generate the first internal data ID1<1:16> by inverting or non-inverting any one of the first pattern data PD1<1:16> and the second pattern data PD2<1:16> depending on the logic levels of the first data select signal DSEL<1> and the first data inversion signal DINV<1> in synchronization with the strobe signal STP. Because operations in which the internal data generation circuit 330 generates the second internal data ID2<1:16> to the sixteenth internal data ID16<1:16> are the same as the operation of generating the first internal data ID1<1:16> except that only input/output signals are different, detailed descriptions thereof will be omitted herein.

Figure 6:
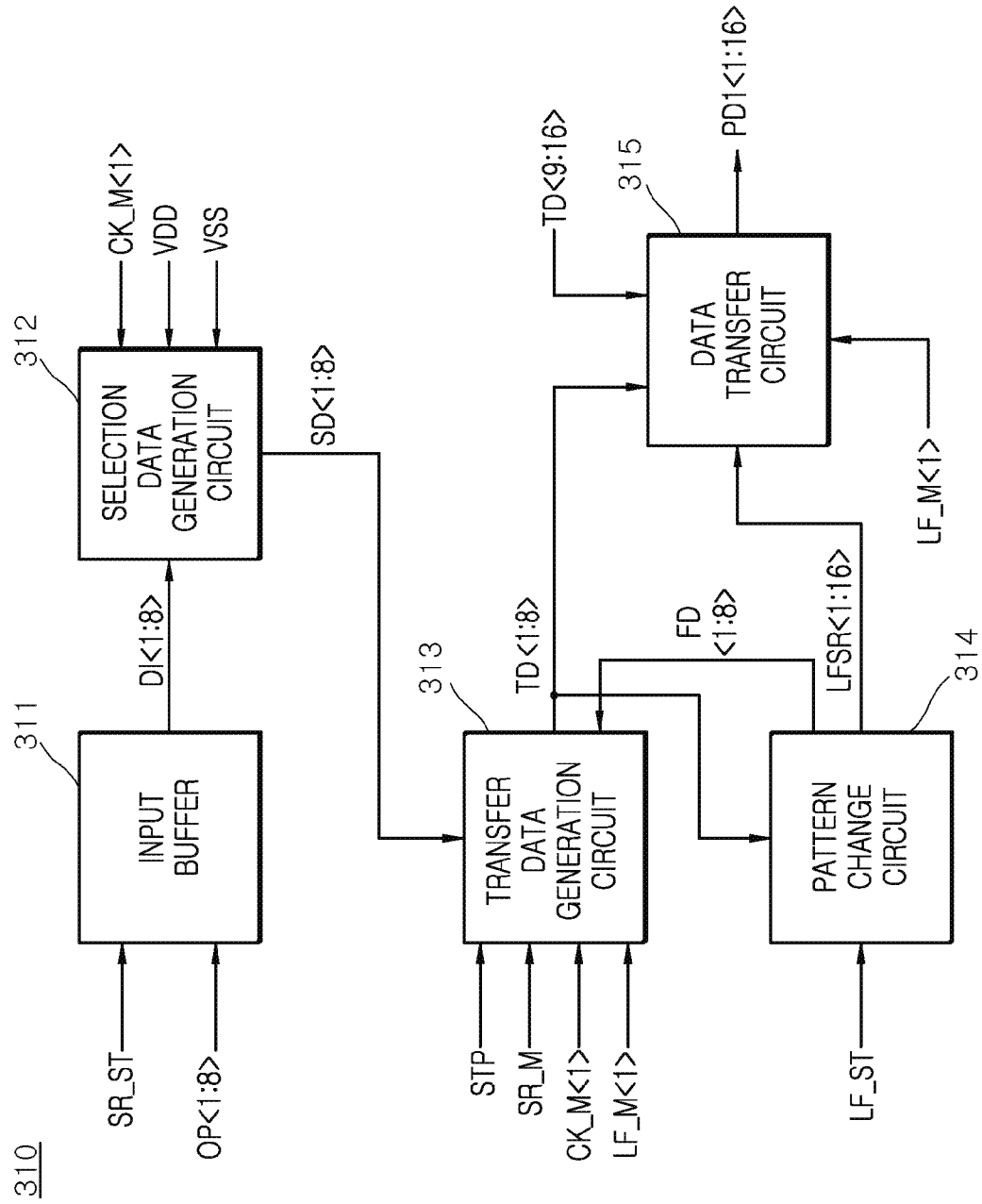
FIG. 6 is a block diagram illustrating a representation of an example of the configuration of the first pattern data generation circuit included in the data processing circuit illustrated in FIG. 5.

Referring to FIG. 6, the first pattern data generation circuit 310 may include an input buffer 311, a selection data generation circuit 312, a transfer data generation circuit 313, a pattern change circuit 314 and a data transfer circuit 315.

The input buffer 311 may receive the operation signal OP<1:8> and thereby generate input data DI<1:8> in the case where the serial start signal SR_ST is inputted. The input buffer 311 may buffer the operation signal OP<1:8> and thereby generate the input data DI<1:8> in the case where the serial start signal SR_ST is enabled.

The selection data generation circuit 312 may generate selection data SD<1:8> from the input data DI<1:8> or the external powers VDD and VSS depending on the logic level of the first clock mode signal CK_M<1>. The selection data generation circuit 312 may generate the selection data SD<1:8> from the input data DI<1:8> in the case where the first clock mode signal CK_M<1> is disabled. The selection data generation circuit 312 may generate the selection data SD<1:8> from the external powers VDD and VSS in the case where the first clock mode signal CK_M<1> is enabled. The external power VDD may be set as a power supply voltage which is supplied to the second semiconductor device 20. The external power VDD may be set to a logic high level in accordance with an embodiment of the disclosure. The external power VSS may be set as a ground voltage which is supplied to the second semiconductor device 20. The external power VSS may be set to a logic low level in accordance with an embodiment of the disclosure.

The transfer data generation circuit 313 may generate the first transfer data TD<1:8> from the selection data SD<1:8> in the case where any one of the serial mode signal SR_M and the first clock mode signal CK_M<1> is enabled in synchronization with the strobe signal STP. The transfer data generation circuit 313 may generate the first transfer data TD<1:8> from feedback data FD<1:8> in the case where the first random mode signal LF_M<1> is enabled.

The pattern change circuit 314 may receive the first transfer data TD<1:8> and change the logic level combination of the feedback data FD<1:8> in the case where the random start signal LF_ST is inputted. The pattern change circuit 314 may generate the random data LFSR<1:16> having a random logic level combination from the first transfer data TD<1:8> in the case where the random start signal LF_ST is inputted.

The data transfer circuit 315 may generate the first pattern data PD1<1:16> from the first transfer data TD<1:8> and the second transfer data TD<9:16> which is inputted from the second pattern data generation circuit 320, in the case where the first random mode signal LF_M<1> is disabled. The data transfer circuit 315 may generate the first pattern data PD1<1:16> from the random data LFSR<1:16> in the case where the first random mode signal LF_M<1> is enabled.

Figure 7:
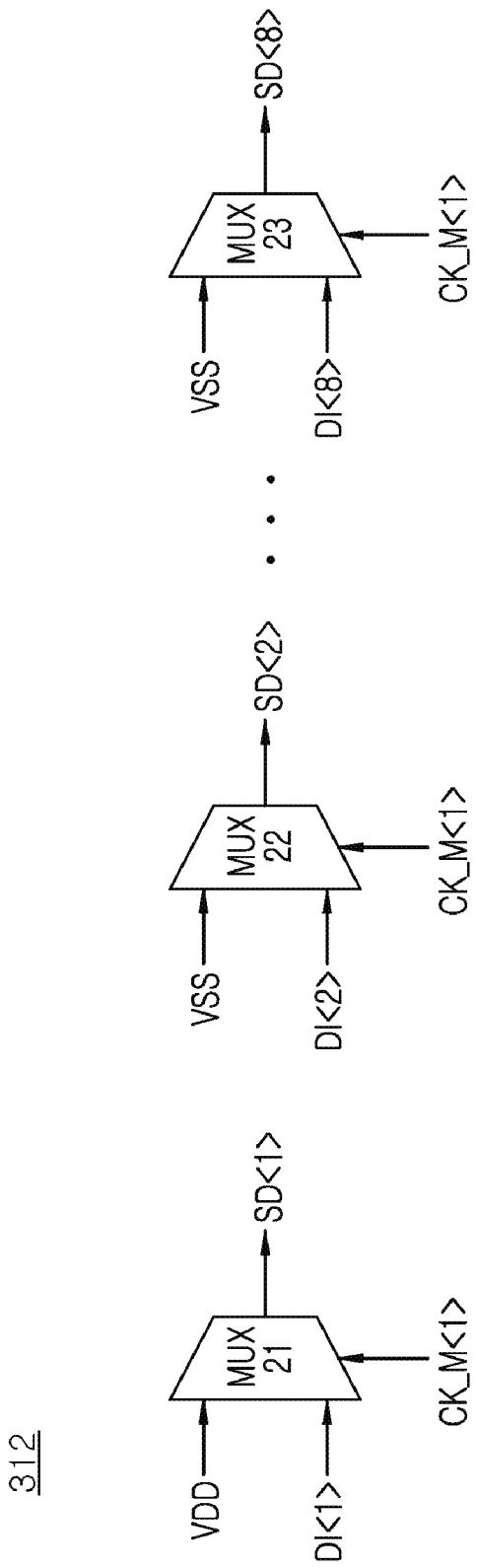
FIG. 7 is a block diagram illustrating a representation of an example of the configuration of the selection data generation circuit included in the first pattern data generation circuit illustrated in FIG. 6.

Referring to FIG. 7, the selection data generation circuit 312 may be realized by multiplexers MUX21, MUX22 and MUX23.

The multiplexer MUX21 may output the power supply voltage VDD as the first bit SD<1> of the selection data SD<1:8> in the case where the first clock mode signal CK_M<1> is enabled. The multiplexer MUX21 may generate the first bit SD<1> of the selection data SD<1:8> to a logic high level in the case where the first clock mode signal CK_M<1> is enabled. The multiplexer MUX21 may output the first bit DI<1> of the input data DI<1:8> as the first bit SD<1> of the selection data SD<1:8> in the case where the first clock mode signal CK_M<1> is disabled.

The multiplexer MUX22 may output the ground voltage VSS as the second bit SD<2> of the selection data SD<1:8> in the case where the first clock mode signal CK_M<1> is enabled. The multiplexer MUX22 may generate the second bit SD<2> of the selection data SD<1:8> to a logic low level in the case where the first clock mode signal CK_M<1> is enabled. The multiplexer MUX22 may output the second bit DI<2> of the input data DI<1:8> as the second bit SD<2> of the selection data SD<1:8> in the case where the first clock mode signal CK_M<1> is disabled.

Because operations in which the selection data generation circuit 312 generates the remaining bits SD<3:8> of the selection data SD<1:8> are the same as the operations of generating the first bit SD<1> and the second bit SD<2> of the selection data SD<1:8>, detailed descriptions thereof will be omitted herein. The selection data generation circuit 312 may be realized by eight multiplexers in correspondence to the number of bits of the selection data SD<1:8>. For example, if there are eight multiplexers the first, third, fifth and seventh multiplexers may receive the power supply VDD and the second, fourth, sixth, and eighth multiplexers may receive the ground voltage VSS.

Figure 8:
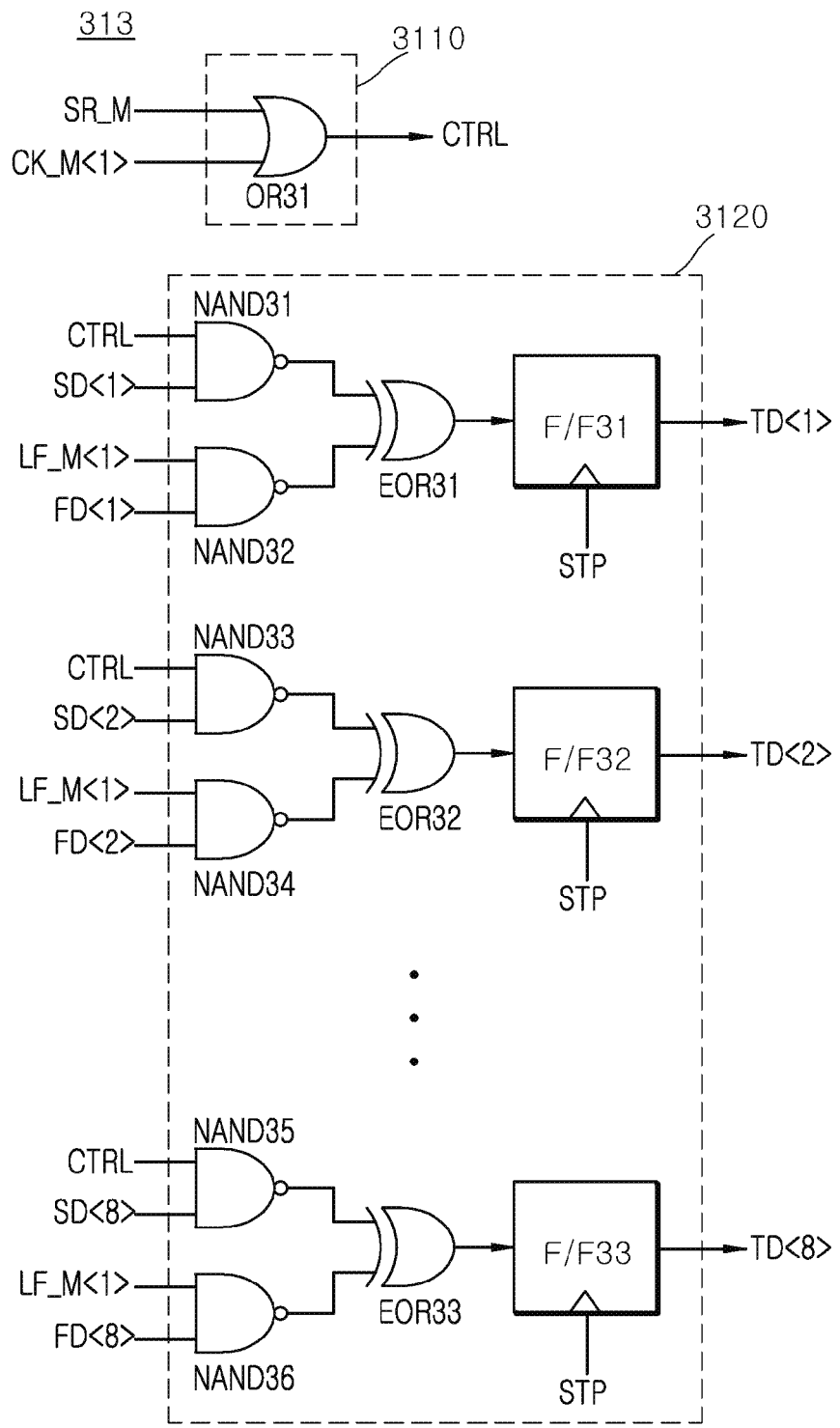
FIG. 8 is a diagram illustrating a representation of an example of the configuration of the transfer data generation circuit included in the first pattern data generation circuit illustrated in FIG. 6.

Referring to FIG. 8, the transfer data generation circuit 313 may include a control signal generation circuit 3110 and a transfer data output circuit 3120.

The control signal generation circuit 3110 may be configured to perform an OR logic operation and may be realized by, for example but not limited to, an OR gate OR31. The control signal generation circuit 3110 may generate a control signal CTRL which is enabled, in the case where any one of the serial mode signal SR_M and the first clock mode signal CK_M<1> is enabled. The control signal generation circuit 3110 may generate the control signal CTRL by performing an OR logic calculation on the serial mode signal SR_M and the first clock mode signal CK_M<1>.

The transfer data output circuit 3120 may be configured to perform NAND and exclusive OR logic operations and may be realized by, for example but not limited to, NAND gates NAND31, NAND32, NAND33, NAND34, NAND35 and NAND36, exclusive OR gates EOR31, EOR32 and EOR33.

The transfer data output circuit 3120 may also include, for example but not limited to, flip-flops F/F31, F/F32 and F/F33.

The transfer data output circuit 3120 may generate the first bit TD<1> of the first transfer data TD<1:8> from the first bit SD<1> of the selection data SD<1:8> in the case where the control signal CTRL is enabled in synchronization with the strobe signal STP. The transfer data output circuit 3120 may generate the first bit TD<1> of the first transfer data TD<1:8> from the first bit FD<1> of the feedback data FD<1:8> in the case where the first random mode signal LF_M<1> is enabled in synchronization with the strobe signal STP.

Because operations in which the transfer data output circuit 3120 generates the remaining bits TD<2:8> of the first transfer data TD<1:8> are the same as the operation of generating the first bit TD<1> of the first transfer data TD<1:8>, detailed descriptions thereof will be omitted herein.

Figure 9:
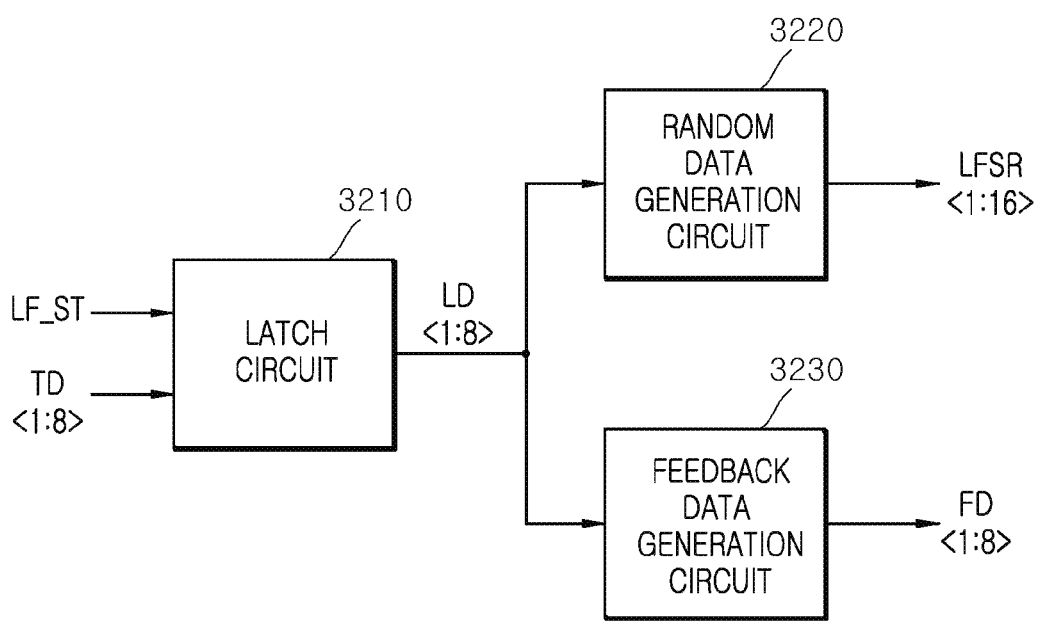
FIG. 9 is a block diagram illustrating a representation of an example of the configuration of the pattern change circuit included in the first pattern data generation circuit illustrated in FIG. 6.

Referring to FIG. 9, the pattern change circuit 314 may include a latch circuit 3210, a random data generation circuit 3220 and a feedback data generation circuit 3230.

The latch circuit 3210 may latch the first transfer data TD<1:8> and generate latch data LD<1:8> from the latched first transfer data TD<1:8>, in the case where the random start signal LF_ST is inputted.

The random data generation circuit 3220 may change the logic level combination of the latch data LD<1:8> and thereby generate the random data LFSR<1:16>. The random data generation circuit 3220 may generate the random data LFSR<1:16> of 16 bits from the latch data LD<1:8> of eight bits. The random data generation circuit 3220 may generate the random data LFSR<1:16> of 16 bits by performing an exclusive OR logic calculation on the bits included in the latch data LD<1:8>.

The feedback data generation circuit 3230 may change the logic level combination of the latch data LD<1:8> and thereby generate the feedback data FD<1:8>. The feedback data generation circuit 3230 may generate the feedback data FD<1:8> of eight bits from the latch data LD<1:8> of eight bits. The feedback data generation circuit 3230 may generate the feedback data FD<1:8> of eight bits by performing an exclusive OR logic calculation on the bits included in the latch data LD<1:8>.

The random data generation circuit 3220 and the feedback data generation circuit 3230 may generate the random data LFSR<1:16> and the feedback data FD<1:8> which have different patterns, by performing exclusive OR logic calculations in different schemes.

Figure 10:
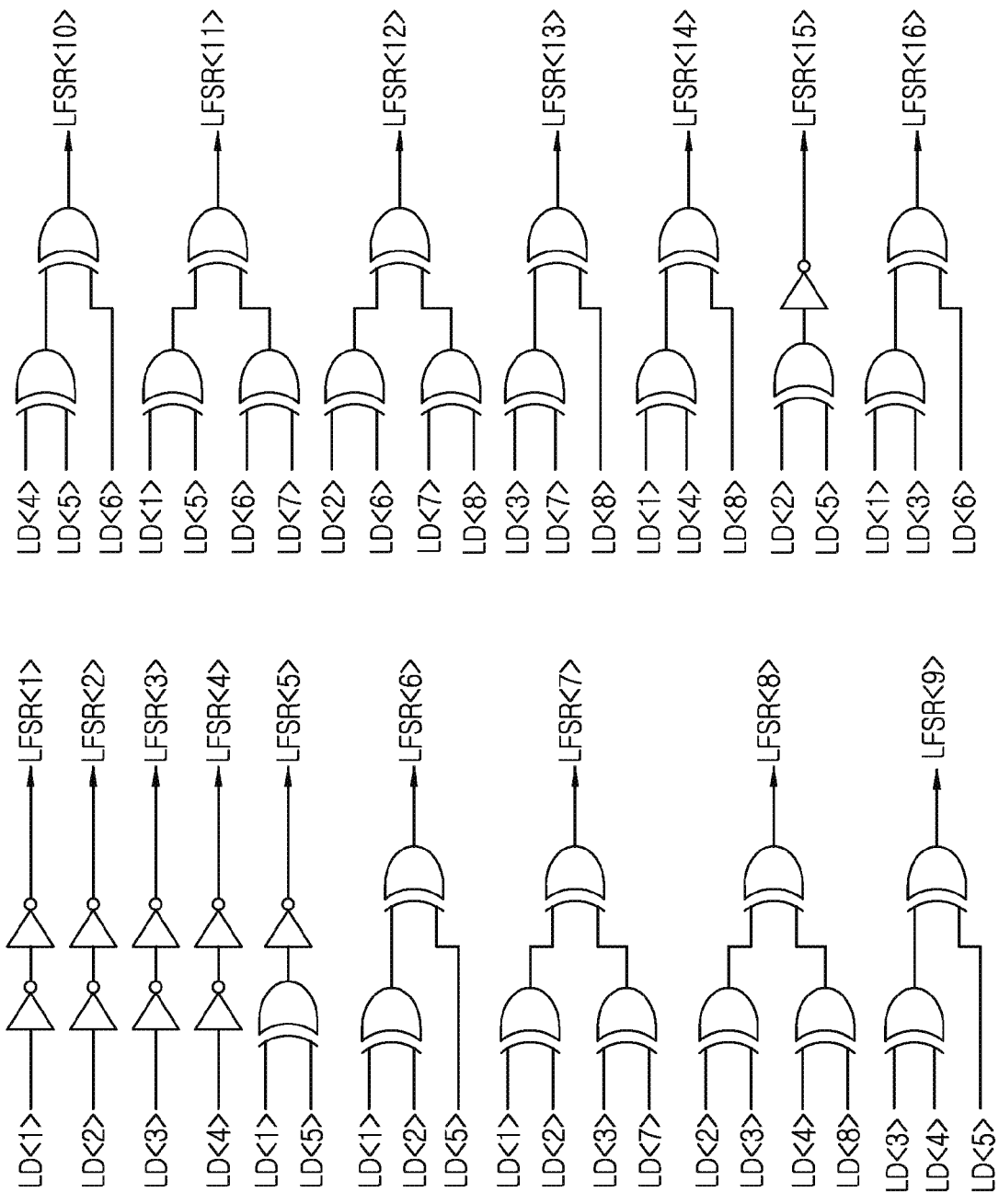
FIG. 10 is a circuit diagram illustrating a representation of an example of the configuration of the random data generation circuit included in the pattern change circuit illustrated in FIG. 9.

Referring to FIG. 10, the random data generation circuit 3220 may be configured to perform inversion and exclusive OR logic operations and may be realized by, for example but not limited to, a plurality of inverters and a plurality of exclusive OR gates. The random data generation circuit 3220 may generate the random data LFSR<1:16> of 16 bits having various logic level combinations from the latch data LD<1:8> of eight bits. While the random data generation circuit 3220 illustrated in FIG. 10 is realized to generate the random data LFSR<1:16> of 16 bits from the latch data LD<1:8> of eight bits, it is to be noted that the random data generation circuit 3220 may be realized to generate random data of various bits depending on an embodiment.

Figure 11:
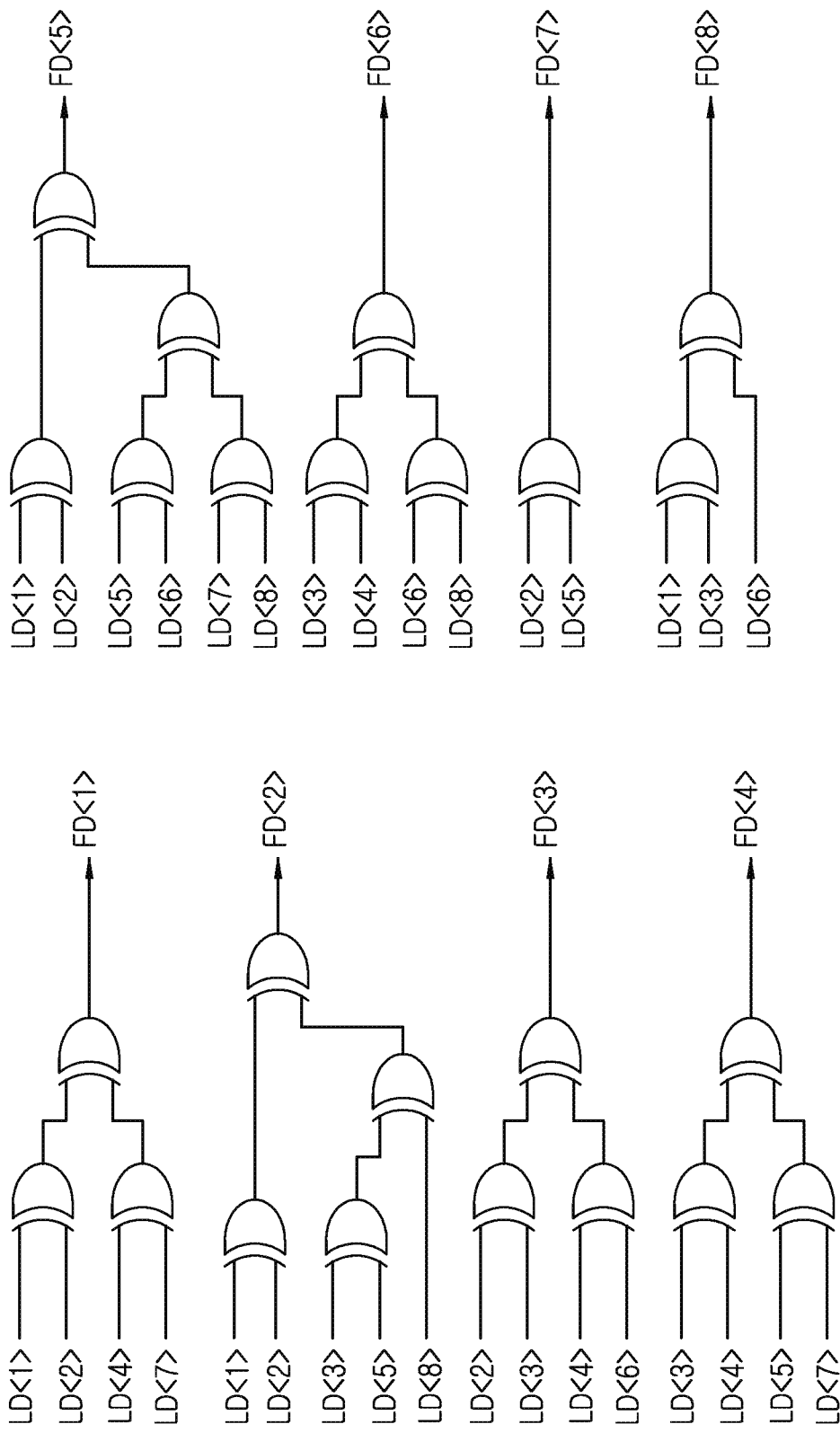
FIG. 11 is a circuit diagram illustrating a representation of an example of the configuration of the feedback data generation circuit included in the pattern change circuit illustrated in FIG. 9.

Referring to FIG. 11, the feedback data generation circuit 3230 may be configured to perform exclusive OR logic operations and may be realized by, for example but not limited to, a plurality of exclusive OR gates. The feedback data generation circuit 3230 may generate the feedback data FD<1:8> of eight bits having various logic level combinations from the latch data LD<1:8> of eight bits. While the feedback data generation circuit 3230 illustrated in FIG. 11 is realized to generate the feedback data FD<1:8> of eight bits from the latch data LD<1:8> of eight bits, it is to be noted that the feedback data generation circuit 3230 may be realized to generate feedback data of various bits depending on an embodiment.

Meanwhile, because the second pattern data generation circuit 320 is realized by the same circuit and performs the same operation as the first pattern data generation circuit 310 illustrated in FIGS. 6 to 11, except that only input/output signals are different, detailed descriptions thereof will be omitted herein. Referring to FIG. 5, In an embodiment, the second pattern data generation circuit 320 may generate second pattern data PD2<1:16> from the second transfer data TD<9:16> and first transfer data TD<1:8> which is inputted from the first pattern data generation circuit 310, in the case where the second random mode signal LF_M<2> is disabled.

Figure 12:
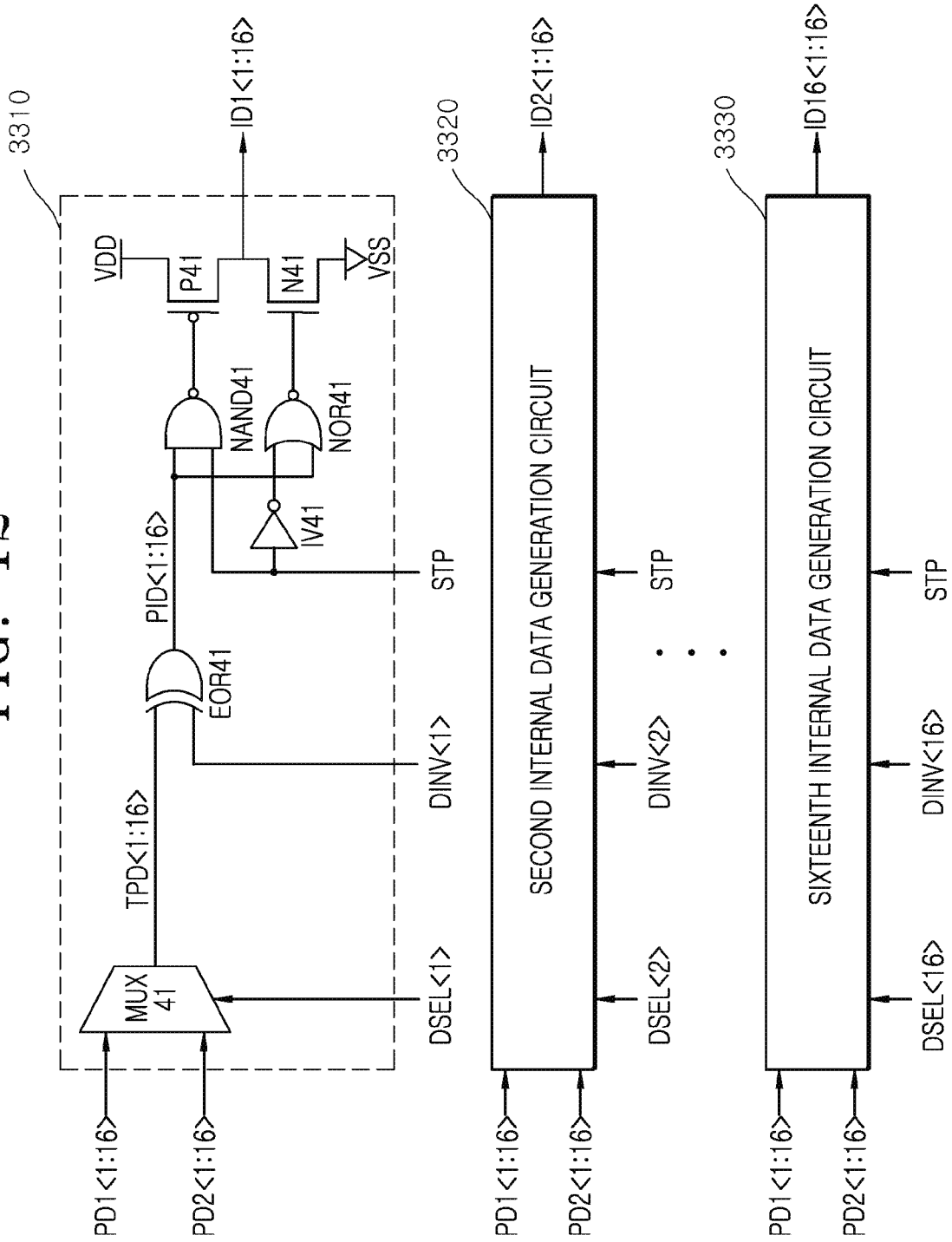
FIG. 12 is a diagram illustrating a representation of an example of the configuration of the internal data generation circuit included in the data processing circuit illustrated in FIG. 5.

Referring to FIG. 12, the internal data generation circuit 330 may include first to sixteenth internal data generation circuits 3310 to 3330.

The first internal data generation circuit 3310 may be configured to perform logic operations and may be realized by, for example but not limited to, a multiplexer MUX41, an exclusive OR gate EOR41, an inverter IV41, a NAND gate NAND41, a NOR gate NOR41, a PMOS transistor P41 and an NMOS transistor N41.

The multiplexer MUX41 may output the first pattern data PD1<1:16> as transfer pattern data TPD<1:16> in the case where the first data select signal DSEL<1> is at a logic high level. The multiplexer MUX41 may output the second pattern data PD2<1:16> as the transfer pattern data TPD<1:16> in the case where the first data select signal DSEL<1> is at a logic low level.

The exclusive OR gate EOR41 may invert and buffer the transfer pattern data TPD<1:16> and thereby generate pre-internal data PID<1:16> in the case where the first data inversion signal DINV<1> is at a logic high level. The exclusive OR gate EOR41 may buffer the transfer pattern data TPD<1:16> and thereby generate the pre-internal data PID<1:16> in the case where the first data inversion signal DINV<1> is at a logic low level.

The inverter IV41 may invert and buffer the strobe signal STP and thereby output an output signal.

The NAND gate NAND41 may invert and buffer the pre-internal data PID<1:16> and thereby output an output signal in the case where the strobe signal STP is at a logic high level.

The NOR gate NOR41 may invert and buffer the pre-internal data PID<1:16> and thereby output an output signal in the case where the output signal of the inverter IV41 is at a logic low level.

The PMOS transistor P41 may generate the first internal data ID1<1:16> of a logic high level in the case where the output signal of the NAND gate NAN D41 is at a logic low level.

The NMOS transistor N41 may generate the first internal data ID1<1:16> of a logic low level in the case where the output signal of the NOR gate NOR41 is at a logic high level.

While the first internal data generation circuit 3310 illustrated in FIG. 12 is illustrated as one circuit, it is to be noted that the first internal data generation circuit 3310 may be realized by 16 circuits in correspondence to the number of bits of the first internal data ID1<1:16>. Also, because the second to sixteenth internal data generation circuits 3320 to 3330 are realized by the same circuit and perform the same operation as the first internal data generation circuit 3310 except that only input/output signals are different, detailed descriptions thereof will be omitted herein.

An operation of testing memory cells by entering the serial mode and an operation of testing memory cells by entering the clock mode and the random mode will be separately described hereunder with reference to FIGS. 1 to 12.

First, the operation of testing memory cells by entering the serial mode will be described hereunder.

The first semiconductor device 10 outputs the mode select signal MD_SEL, the first to third code signals CODE<1:3>, the serial start signal SR_ST and the operation signal OP<1:8>. At this time, the mode select signal MD_SEL is outputted at the logic high level H and the first code signal CODE<1> is outputted at the logic low level L.

The strobe signal generation circuit 100 generates the strobe signal STP including a pulse generated by receiving the serial start signal SR_ST.

The operation control circuit 200 receives the mode select signal MD_SEL of the logic high level H and the first code signal CODE<1> of the logic low level L, and thereby generates the serial mode signal SR_M which is enabled to the logic high level H.

The first pattern data generation circuit 310 of the data processing circuit 300 generates the first transfer data TD<1:8> from the operation signal OP<1:8> because the serial mode signal SR_M is enabled to the logic high level H in synchronization with the strobe signal STP. The first pattern data generation circuit 310 generates the first pattern data PD1<1:16> from the first transfer data TD<1:8> and the second transfer data TD<9:16> because the first random mode signal LF_M<1> is disabled in synchronization with the strobe signal STP.

The second pattern data generation circuit 320 of the data processing circuit 300 generates the second transfer data TD<9:16> from the operation signal OP<1:8> because the serial mode signal SR_M is enabled to the logic high level H in synchronization with the strobe signal STP. The second pattern data generation circuit 320 generates the second pattern data PD2<1:16> from the first transfer data TD<1:8> and the second transfer data TD<9:16> because the second random mode signal LF_M<2> is disabled in synchronization with the strobe signal STP.

The internal data generation circuit 330 generates the first to sixteenth internal data ID1<1:16> to ID16<1:16> by inverting or non-inverting any one of the first pattern data PD1<1:16> and the second pattern data PD2<1:16> depending on the logic levels of the first data select signal DSEL<1> and the first data inversion signal DINV<1> in synchronization with the strobe signal STP.

The memory circuit 400 stores the first to sixteenth internal data ID1<1:16> to ID16<1:16> in the plurality of memory cells MC, and generates the output data DOUT<1:16> from any one of the stored first to sixteenth internal data ID1<1:16> to ID16<1:16>.

The first semiconductor device 10 senses the logic level of the output data DOUT<1:16> and thereby tests a failure of the memory circuit 400 included in the second semiconductor device 20. The first semiconductor device 10 may determine the memory circuit 400 included in the second semiconductor device 20, has failed, in the case where the logic level combination of the first to eighth bits DOUT<1:8> included in the output data DOUT<1:16> is different from the logic level combination of the operation signal OP<1:8>. The first semiconductor device 10 may determine the memory circuit 400 included in the second semiconductor device 20, has failed, in the case where the logic level combination of the ninth to sixteenth bits DOUT<9:16> included in the output data DOUT<1:16> is different from the logic level combination of the operation signal OP<1:8>.

Next, the operation of testing memory cells as the first clock mode signal CK_M<1> is enabled by entering the clock mode and the second random mode signal LF_M<2> is enabled by entering the random mode will be described hereunder.

The first semiconductor device 10 outputs the mode select signal MD_SEL, the first to third code signals CODE<1:3> and the random start signal LF_ST. At this time, the mode select signal MD_SEL is outputted at the logic high level H, the first code signal CODE<1> is outputted at the logic high level H, the second code signal CODE<2> is outputted at the logic low level L and the third code signal CODE<3> is outputted at the logic high level H.

The strobe signal generation circuit 100 generates the strobe signal STP including a pulse generated by receiving the random start signal LF_ST.

The operation control circuit 200 receives the mode select signal MD_SEL of the logic high level H, the first code signal CODE<1> of the logic high level H, the second code signal CODE<2> of the logic low level L and the third code signal CODE<3> of the logic high level H, and thereby generates the first clock mode signal CK_M<1> and the second random mode signal LF_M<2> which are enabled to the logic high levels H.

The first pattern data generation circuit 310 of the data processing circuit 300 generates the first transfer data TD<1:8> from the external powers VDD and VSS (see FIG. 6) because the first clock mode signal CK_M<1> is enabled to the logic high level H in synchronization with the strobe signal STP. The first pattern data generation circuit 310 generates the first pattern data PD1<1:16> from the first transfer data TD<1:8> and the second transfer data TD<9:16> because the first random mode signal LF_M<1> is disabled in synchronization with the strobe signal STP.

The second pattern data generation circuit 320 of the data processing circuit 300 generates the second transfer data TD<9:16> from the feedback data FD<1:8> because the second random mode signal LF_M<2> is enabled to the logic high level H in synchronization with the strobe signal STP. The second pattern data generation circuit 320 generates the second pattern data PD2<1:16> from the random data (not illustrated) generated from the second transfer data TD<9:16> because the second random mode signal LF_M<2> is enabled to the logic high level H in synchronization with the strobe signal STP.

The internal data generation circuit 330 generates the first to sixteenth internal data ID1<1:16> to ID16<1:16> by inverting or non-inverting any one of the first pattern data PD1<1:16> and the second pattern data PD2<1:16> depending on the logic levels of the first data select signal DSEL<1> and the first data inversion signal DINV<1> in synchronization with the strobe signal STP.

The memory circuit 400 stores the first to sixteenth internal data ID1<1:16> to ID16<1:16> in the plurality of memory cells MC, and generates the output data DOUT<1:16> from any one of the stored first to sixteenth internal data ID1<1:16> to ID16<1:16>.

The first semiconductor device 10 senses the logic level of the output data DOUT<1:16> and thereby tests a failure of the memory circuit 400 included in the second semiconductor device 20. The first semiconductor device 10 may determine the memory circuit 400 included in the second semiconductor device 20, has failed, in the case where the logic levels of the adjacent bits included in the output data DOUT<1:8> are not different from one another. Moreover, the first semiconductor device 10 may determine the memory circuit 400 included in the second semiconductor device 20, has failed, in the case where the logic level combination of the output data DOUT<9:16> is not a random logic level combination.

As is apparent from the above descriptions, in the semiconductor device and the semiconductor system according to the embodiments of the disclosure, it may be possible to enter a plurality of operation modes depending on a combination of code signals and generate data having different patterns according to the respective operation modes. Moreover, in the semiconductor device and the semiconductor system according to the embodiments of the disclosure, it may be possible to enter a plurality of operation modes for generating data having various patterns depending on a combination of code signals and test a plurality of memory cells by using the data having the various patterns.

Figure 13:
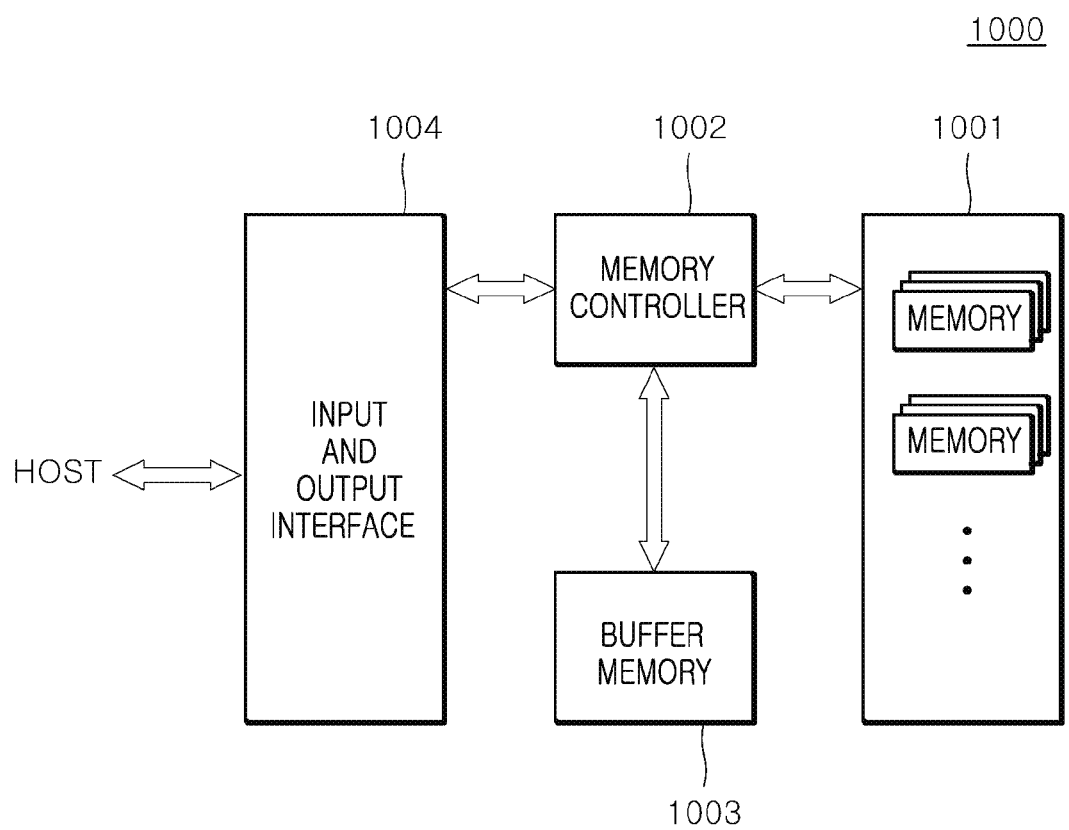
FIG. 13 is a diagram illustrating a representation of an example of the configuration of an electronic system to which the semiconductor system illustrated in FIGS. 1 to 12 is applied, in accordance with an embodiment of the disclosure.

The semiconductor devices and the semiconductor systems described above with reference to FIGS. 1 to 12 may be applied to an electronic system which includes a memory system, a graphic system, a computing system or a mobile system. For example, referring to FIG. 13, an electronic system 1000 in accordance with an embodiment of the disclosure may include a data storage 1001, a memory controller 1002, a buffer memory 1003 and an input/output interface 1004.

The data storage 1001 stores data applied from the memory controller 1002, and reads out stored data and outputs the read-out data to the memory controller 1002, according to control signals from the memory controller 1002. The data storage 1001 may include the second semiconductor devices 20 illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor devices 10 illustrated in FIG. 1. While the memory controller 1002 is illustrated as one block in FIG. 13, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as Universal Serial Bus (USB), MultiMediaCard (MMC), Peripheral Component Interconnect Express (PCI-E), Serial Attached SCSI (SAS), Serial ATA (SATA), Parallel ATA (PATA), Small Computer System Interface (SCSI), Enhanced Small Device Interface (ESDI) and Integrated Drive Electronics (IDE).

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor devices and the semiconductor systems described herein should not be limited based on the described embodiments.

What is claimed is:

1. A semiconductor device comprising:
   a data processing circuit configured to receive an operation signal including a first combination of bits and generate internal data including the first combination of bits when the semiconductor device is operating in a serial mode, generate internal data including sequential bits including alternating logic values when the semiconductor device is operating in a clock mode, and generate internal data including a random combination of bits, logic levels of which are generated randomly when the semiconductor device is operating in a random mode; and
   a memory circuit including a plurality of memory cells, and configured to store the internal data in the plurality of memory cells and generate output data from the stored internal data.

2. The semiconductor device according to claim 1, further comprising:
   an operation control circuit configured to generate a serial mode signal depending on a mode select signal and a code signal, and
   wherein the data processing circuit generates the internal data including the first combination of the bits when the serial mode signal is enabled.

3. The semiconductor device according to claim 1, further comprising:
   an operation control circuit configured to generate first and second clock mode signals depending on a mode select signal and a code signal, and
   wherein the data processing circuit generates the internal data including the sequential bits with the alternating logic values when the first and second clock mode signals are enabled.

4. The semiconductor device according to claim 1, further comprising:
   an operation control circuit configured to generate a first clock mode signal and a second random mode signal depending on a mode select signal and code signals, and wherein the data processing circuit generates the internal data including a first portion of sequential bits including the alternating logic values and including a second portion of sequential bits including the random combination of bits when the first clock mode signal and the second random mode are enabled.

5. The semiconductor device according to claim 1, further comprising:
an operation control circuit configured to generate a second clock mode signal and a first random mode signal dependent on a mode select signal and code signals, and
wherein the data processing circuit generates the internal data including a second portion of sequential bits including the alternating logic values and including a first portion of sequential bits including the random combination of bits when the second clock mode signal and the first random mode signal are enabled.

6. The semiconductor device according to claim 1, further comprising:
an operation control circuit configured to generate first and second random mode signals dependent on a mode select signal and code signals, and
wherein the data processing circuit generates the internal data including the random combination of bits, the logic levels of which are generated randomly when the first and second random mode signals are enabled.

7. The semiconductor device according to claim 1, wherein the internal data is generated from first and second voltages received externally from the semiconductor device and by the semiconductor device when operating in the clock mode.

8. The semiconductor device according to claim 1, wherein the serial mode is an operation of testing the plurality of memory cells by storing the internal data generated from the operation signal, in the plurality of memory cells, the clock mode is an operation of testing a failure of the memory circuit by sensing that logic levels of adjacent bits included in the output data are realized as different logic levels, and the random mode is an operation of testing the plurality of memory cells by storing the internal data including a random combination, in the plurality of memory cells.

9. The semiconductor device according to claim 1, further comprising:
an operation control circuit configured to generate a serial mode signal, first and second clock mode signals, and first and second random mode signals depending on a logic level combination of a mode select signal and first to third code signals to enter the data processing circuit into the serial mode, the clock mode, or the random mode,
wherein the data processing circuit comprises:
a first pattern data generation circuit configured to generate first pattern data from the operation signal when the serial mode signal is enabled in synchronization with a strobe signal, generate the first pattern data from first and second voltages received externally from the semiconductor device when the first clock mode signal is enabled, and generate the first pattern data including a random combination when the first random mode signal is enabled,
a second pattern data generation circuit configured to generate second pattern data from the operation signal when the serial mode signal is enabled in synchronization with the strobe signal, generate the second pattern data from the first and second voltages when the second clock mode signal is enabled, and generate the second pattern data including a random combination when the second random mode signal is enabled; and
an internal data generation circuit configured to generate the internal data by inverting or non-inverting any one of the first and second pattern data depending on logic levels of a data select signal and a data inversion signal in synchronization with the strobe signal.

10. The semiconductor device according to claim 9, wherein the first pattern data generation circuit comprises:
a first input buffer configured to generate first input data by receiving the operation signal when a serial start signal is inputted;
a first selection data generation circuit configured to generate first selection data from the first input data or the first and second voltages depending on a logic level of the first clock mode signal;
a first transfer data generation circuit configured to generate first transfer data from the first selection data when any one of the serial mode signal and the first clock mode signal is enabled in synchronization with the strobe signal, and generate the first transfer data from first feedback data when the first random mode signal is enabled;
a first pattern change circuit configured to change a logic level combination of the first feedback data by receiving the first transfer data when the random start signal is inputted, and generate first random data including a random logic level combination from the first transfer data; and
a first data transfer circuit configured to generate the first pattern data from the first transfer data and second transfer data which is inputted from the second pattern data generation circuit or from the first random data depending on the first random mode signal.

11. The semiconductor device according to claim 10, wherein the first transfer data generation circuit comprises:
a first control signal generation circuit configured to generate a first control signal which is enabled, when any one of the serial mode signal and the first clock mode signal is enabled; and
a first transfer data output circuit configured to generate the first transfer data from the first selection data when the first control signal is enabled in synchronization with the strobe signal, and generate the first transfer data from the first feedback data when the first random mode signal is enabled.

12. The semiconductor device according to claim 10, wherein the first pattern change circuit comprises:
a first latch circuit configured to latch the first transfer data when the random start signal is inputted, and generate first latch data from the latched first transfer data;
a first random data generation circuit configured to generate the first random data by changing a logic level combination of the first latch data; and
a first feedback data generation circuit configured to generate the first feedback data by changing a logic level combination of the first latch data.

13. The semiconductor device according to claim 12, wherein the first random data generation circuit generates the first random data including a first pattern by performing an exclusive OR logic calculation on bits included in the first latch data, and the first feedback data generation circuit generates the first feedback data including a second pattern by performing an exclusive OR logic calculation on bits included in the first latch data.

14. The semiconductor device according to claim 9, wherein the second pattern data generation circuit comprises:
  a second input buffer configured to generate second input data by receiving the operation signal when the serial start signal is inputted;
  a second selection data generation circuit configured to generate second selection data from the second input data or the first and second voltages depending on a logic level of the second clock mode signal;
  a second transfer data generation circuit configured to generate the second transfer data from the second selection data when any one of the serial mode signal and the second clock mode signal is enabled in synchronization with the strobe signal, and generate the second transfer data from second feedback data when the second random mode signal is enabled;
  a second pattern change circuit configured to change a logic level combination of the second feedback data by receiving the second transfer data when the random start signal is inputted, and generate second random data including a random logic level combination from the second transfer data; and
  a second data transfer circuit configured to generate the second pattern data from the second transfer data and the first transfer data which is inputted from the first pattern data generation circuit or from the second random data depending on the second random mode signal.

15. The semiconductor device according to claim 14, wherein the second transfer data generation circuit comprises:
  a second control signal generation circuit configured to generate a second control signal which is enabled, when any one of the serial mode signal and the second clock mode signal is enabled; and
  a second transfer data output circuit configured to generate the second transfer data from the second selection data when the second control signal is enabled in synchronization with the strobe signal, and generate the second transfer data from the second feedback data when the second random mode signal is enabled.

16. The semiconductor device according to claim 14, wherein the second pattern change circuit comprises:
  a second latch circuit configured to latch the second transfer data when the random start signal is inputted, and generate second latch data from the latched second transfer data;
  a second random data generation circuit configured to generate the second random data by changing a logic level combination of the second latch data; and
  a second feedback data generation circuit configured to generate the second feedback data by changing a logic level combination of the second latch data.

17. The semiconductor device according to claim 16, wherein the second random data generation circuit generates the second random data including a third pattern by performing an exclusive OR logic calculation on bits included in the second latch data, and the second feedback data generation circuit generates the second feedback data including a fourth pattern by performing an exclusive OR logic calculation on bits included in the second latch data.

18. A semiconductor system comprising:
  a first semiconductor device configured to output a mode select signal, a code signal, and an operation signal, and receive output data; and
  a second semiconductor device configured to operate in a serial mode, a clock mode, and a random mode depending on the mode select signal and the code signal, generate internal data including a first combination of bits from the operation signal of which has the first combination of bits when operating in the serial mode, generate internal data including sequential bits including alternating logic values when operating in the clock mode, generate internal data including a random combination of bits, logic levels of which are generated randomly when operating in the random mode, store the internal data, and output the internal data as the output data.

19. The semiconductor system according to claim 18, wherein the first semiconductor device is configured to output a serial start signal and a random start signal, and
  wherein the second semiconductor device generates the input data from the internal data from the operation signal in synchronization with the serial start signal, generates the internal data from a first and second voltages received externally from the second semiconductor device, and generates the internal data including the random combination of bits in synchronization with the random start signal.

20. The semiconductor system according to claim 18, wherein the second semiconductor device includes an operation control circuit configured to generate a serial mode signal depending on the mode select signal and the code signal, and
  wherein the second semiconductor device includes a data processing circuit configured to generate the internal data including the first combination of the bits when the serial mode signal is enabled.

21. The semiconductor system according to claim 18, wherein the second semiconductor device includes an operation control circuit configured to generate first and second clock mode signals depending on the mode select signal and the code signal, and
  wherein the second semiconductor device includes a data processing circuit configured to generate the internal data including the sequential bits with the alternating logic values when the first and second clock mode signals are enabled.

22. The semiconductor system according to claim 18, wherein the second semiconductor device includes an operation control circuit configured to generate a first clock mode signal and a second random mode signal depending on the mode select signal and the code signal, and
  wherein the second semiconductor device includes a data processing circuit configured to generate the internal data including a first portion of sequential bits including the alternating logic values and including a second portion of sequential bits including the random combination of bits when the first clock mode signal and the second random mode are enabled.

23. The semiconductor system according to claim 18, wherein the second semiconductor device includes an operation control circuit configured to generate a second clock mode signal and a first random mode signal dependent on the mode select signal and the code signal, and
  wherein the second semiconductor device includes a data processing circuit configured to generate the internal data including a second portion of sequential bits including the alternating logic values and including a first portion of sequential bits including the random combination of bits when the second clock mode signal and the first random mode signal are enabled.

24. The semiconductor system according to claim 18,
wherein the second semiconductor device includes an operation control circuit configured to generate first and second random mode signals dependent on the mode select signal and the code signal, and
wherein the second semiconductor device includes a data processing circuit configured to generate the internal data including the random combination of bits, the logic levels of which are generated randomly when the first and second random mode signals are enabled.

25. The semiconductor system according to claim 18,
wherein the internal data is stored within a plurality of memory cells included in the memory circuit which is included in the second semiconductor device, and
wherein the serial mode is an operation of testing the plurality of memory cells by storing the internal data generated from the operation signal, in the plurality of memory cells, the clock mode is an operation of testing a failure of the memory circuit by sensing that logic levels of adjacent bits included in the output data are realized as different logic levels, and the random mode is an operation of testing the plurality of memory cells by storing the internal data including a random combination, in the plurality of memory cells.

* * * * *